United States Patent
Walter (10) Patent No.: US 6,203,851 B1
(45) Date of Patent: Mar. 20, 2001

(54) GAS PHASE COATING PROCESS AND APPARATUS FOR GAS-PHASE COATING OF WORKPIECES

(75) Inventor: Heinrich Walter, Friedberg (DE)

(73) Assignee: MTU Motoren-und Turbinen-Union München GmbH, Munich (DE)

( * ) Notice: Subject to any disclaimer, the term of this patent is extended or adjusted under 35 U.S.C. 154(b) by 0 days.

(21) Appl. No.: 09/239,130

(22) Filed: Jan. 28, 1999

(30) Foreign Application Priority Data

Jan. 30, 1998 (DE) .............................................. 198 03 740

(51) Int. Cl.[7] .................................................... C23C 16/10
(52) U.S. Cl. ........................ 427/248.1; 427/250; 427/252; 427/255.31
(58) Field of Search ................................ 427/248.1, 250, 427/252, 124, 126.3, 126.4, 255.31

(56) References Cited

U.S. PATENT DOCUMENTS

| | | |
|---|---|---|
| 2,650,564 | 9/1953 | Fink . |
| 5,254,530 | 10/1993 | Sugimoto et al. . |
| 5,368,888 | * 11/1994 | Rigney ................................. 427/237 |
| 5,455,071 | * 10/1995 | Pillhoefer et al. .................... 427/253 |
| 5,945,162 | * 8/1999 | Senateur et al. .................. 427/248.1 |

FOREIGN PATENT DOCUMENTS

| | | |
|---|---|---|
| 1 265 530 | 2/1962 | (DE) . |
| 196 07 625 | 12/1996 | (DE) . |
| 0 752 482 | 8/1997 | (EP) . |
| 62-227091 | * 10/1987 | (JP) . |

OTHER PUBLICATIONS

"Preparation of YSZ layers by MOCVD: influence of experimental parameters on the morphology of the films," by G. Garcia, J. Casado, J. Llibre, A. Figueras, Journal of Crystal Growth 156 (1995 426–432.
Patent Abstract of Japan Application No. 61248567, application date Oct. 20, 1986.
JP 0060166597 AA—C30B 29/22 1991 42986—19/10/90 1990 280706—Nanatane Ken.

* cited by examiner

*Primary Examiner*—Timothy Meeks
(74) *Attorney, Agent, or Firm*—Schiff Hardin & Waite (57) ABSTRACT

In a gas phase coating process for coating turbines blades or housing parts, one or more workpieces to be coated are arranged in a container that is heated. Propellant is supplied to the container via a propellant pipe. A donor substance is arranged at the floor of the container together with an activator and forms a coating gas that is circulated pulse-like in the interior of the container by means for circulation, for example, a Venturi nozzle from which the propellant emerges.

17 Claims, 6 Drawing Sheets

GAS PHASE COATING PROCESS AND APPARATUS FOR GAS-PHASE COATING OF WORKPIECES

FIELD OF THE INVENTION

The present invention relates to a gas phase coating process wherein one or more workpieces to be coated are arranged in a container, and whereby the container is heated and a donor substance forms a coating gas that comes into contact with the workpieces. The present is also directed to an apparatus for gas-phase coating of workpieces.

BACKGROUND OF THE INVENTION

In known apparatus and processes for gas phase coating of workpieces, for example, turbine blades, the workpieces are arranged, for example, in the upper region of a container. In its lower region, the container comprises a carrier gas inlet and a carrying grid for the acceptance of a donor metal granulate and an activator powder. The container is annealed for a certain time under argon or $H_2$ and a donor metal gas forms in the container in the proximity of the donor metal granulate.

The problem thereby arises that the heavy donor metal gasses that form must rise from the donor metal granulate to the parts to be coated, whereby a dilution of the donor metal gasses occurs in vertical direction according to the barometric altitude formula, thereby leading to different coat thicknesses on the parts dependent on their geodetic height relative to the donor metal. Particularly given containers with large payload spaces, a pronounced coat gradient arises in barometric dependence from bottom to top due to the heaviness of the coating gas. It is thereby of no consequence whether the donor metal is distributed at the floor of the container and/or under the cover of the container or, respectively, reactor or whether a molten donor metal is employed. When coating inside surfaces of hollow parts, the additional problem arises that the coating thickness decreases the farther the surface to be coated lies in the inside of the part.

Attempts have been made to control the gas quality and to improve it to a certain extent with a gas rinse conduit conducted into the reactor. This arrangement, however, only functions with adequately slice coat gradients given payload spaces having a low height. A disadvantageous coat gradient particularly arises given payload space heights of approximately 120 mm and more, i.e. the coated part has different coat thicknesses dependent on its respective height in the reactor during the coating.

WO 92/08821 discloses an apparatus for gas diffusion coating of hollow workpieces with a container that comprises a gas admission and a gas discharge, whereby the gas discharge follows the inside surfaces of the workpiece to be coated. In this method, the workpieces are held at a geodetically low height relative to the donor metal, whereby the donor metal is present in the form of a donor metal body that, while preserving a gap, completely envelopes the outside surfaces of the workpiece to be coated. A carrier gas conducted into the container from above is conducted past the donor metal body arrangement that is arranged above the part to be coated and around the part. Subsequently, the coating gas is conducted through the inside of the part and discharged at the underside of the container. In order to assure a high donor metal concentration in the area of the part, the gas discharge is formed as overflow or, respectively, siphon, so that a donor metal gas sump forms in the area of the part. However, this known apparatus requires an involved arrangement and fashioning of the donor metal body that, over and above this, must be exactly aligned relative to the part and must be matched to its shape. A coating of a variety of parts with different geometries requires respectively different donor metal bodies, which is involved and cost-intensive and leads to low flexibility. Over and above this, a barometric dependency of the donor metal gas concentration also exists given a siphon arrangement.

Therefore, there is a need for a gas phase coating process and an apparatus for gas phase coating which provides a more uniform coating of outside and inside surfaces of the part throughout the entire payload space of the reactor given low outlay and high flexibility.

SUMMARY OF THE INVENTION

The aforementioned needs are satisfied by a gas phase coating process according to the present invention and by an apparatus for gas phase coating according to the present invention.

In the inventive gas phase coating process, one or more workpieces to be coated, a donor substance and, preferably, an activator are arranged in a container and the container is heated, whereby the donor substance forms a coating gas that comes into contact with the workpiece, and whereby the coating gas is circulated in the container at least at times during the coating process. The circulation achieves a uniform coating gas concentration in the container, so that the formation of a coat gradient is avoided.

Advantageously, a propellant that, in particular, can be an inert propellant such as, for example, Ar, He, Kr, Ne is conducted into the container through a Venturi nozzle arranged in the container. A circulation of the coating gas is thus achieved in an especially efficient and cost-beneficial way, whereby the dilution of the coating gas is kept low. By avoiding moving parts, a circulation can also ensue at extremely high temperatures. However, the coating gas can also be mechanically circulated, preferably with a rotating disk and/or a propeller. The employment of a rotating disk in the mechanical circulation of the coating gas leads to a reduced wear even at high temperatures. $H_2$ is also possible as propellant, for example in order to effect the formation of HF or HCl in the coating process.

The coating gas is preferably conducted or, respectively, distributed in the container by one or more distributor diaphragms preferably arranged above and/or below the workpieces to be coated. This is especially advantageous for uniform coating of workpieces that are preferably arranged in different vertical planes of the container.

Advantageously, propellant situated in the container is separated from the coating gas by gravitation in the upper region of the container and is discharged upwardly from the container, whereas the heavier coating gas remains in the container. A high coating gas concentration is thus achieved in the circulation.

The Venturi nozzle is preferably arranged such in the lower region of the container that the coating gas and/or the propellant circulates vertically.

The coating process is preferably implemented at a temperature in the range from approximately 1000° C. through 1300° C., particularly preferably at approximately 1220° C. The donor substance can be a metallic melt or a metallic granulate such as, for example, a chromium granulate, whereby an activator substance that, in particular, can be a powdered halogen, particularly $NH_4Cl$ is preferably added.

The circulation advantageously ensues in a pulsed mode, whereby a circulation is repeatedly implemented at specific time intervals.

Ceramic coats can also be applied to the workpiece, whereby $Zr(tmhd)_4$ and/or $Y(tmhd)_3$ is preferably employed as donor substance. The coating process can thereby also sequence at low process temperatures.

The inventive apparatus for gas phase coating of workpieces comprises a container for the acceptance of at least one workpiece to be coated, a means for offering a donor substance in the container that forms a coating gas during coating; a heating device for heating the container; and means for circulating the coating gas in the container, so that the coating gas circulates in the container during coating.

For circulation, a Venturi nozzle can thereby be arranged at the end of a gas or, respectively, propellant pipe introduced from the outside, and a distributor diaphragm is preferably arranged, for example, in the upper region of the container parallel to the upper limitation of the container. For circulation of the coating gas, the apparatus can comprise a propeller and/or a rotatable disk, and a workpiece holder with a plurality of levels for the acceptance of a plurality of workpieces to be coated at different levels of the container is advantageously provided. The means for the circulation of the coating gas and/or the distributor diaphragm are preferably arranged such that the coating gas is conducted up in a central region of the container and is conducted down in an edge region of the container along the part to be coated while circulating in the container.

According to a further aspect of the invention, a gas phase coating process is disclosed wherein one or more workpieces to be coated are arranged in a container, the container is heated and a donor substance forms a coating gas that comes into contact with the workpiece, comprising the steps:

evaporation of Zr from $Zr(tmhd)_4$ and/or Y from $Y(tmhd)_3$ for forming the coating gas; and conducting the coating gas to the workpieces to be coated, whereby the coating gas is circulated in the container at least at times.

In an embodiment, the present invention provides a process for applying a coating gas to at least one workpiece that comprises the steps of providing a container containing at least one workpiece, a donor substance and an activator, heating the container, donor substance and activator to form a coating gas from the donor substance, and, circulating the donor gas within the container.

In an embodiment, the container further comprises a Venturi nozzle disposed within the container and the circulating step further comprises injecting a propellant into the container through the Venturi nozzle.

In an embodiment, the circulating step is further characterized as mechanically circulating the coating gas with a rotating disk.

In an embodiment, the circulating step is further characterized as mechanically circulating the coating gas with a propeller.

In an embodiment, the propellant is selected from the group consisting of Ar, He, Kr, Ne and $H_2$.

In an embodiment, the container further houses two distributor diaphragms, one distributor diaphragm disposed above the workpiece and one distributor diaphragm disposed below the workpiece. The distributor diaphragm includes holes for distributing the circulating coating gas.

In an embodiment, the container accommodates a plurality of workpieces that are arranged vertically within the container.

In an embodiment, the container further comprises an exhaust outlet and the process further comprises the steps of separating the propellant from the coating gas by gravitation in the upper region of the container and eliminating the propellant from the container through the exhaust outlet.

In an embodiment, the Venturi nozzle is disposed in a lower region of the container so that the coating gas and propellant circulate vertically upward.

In an embodiment, the circulating step is carried out at a temperature ranging from about 1000° C. to about 1300° C.

In an embodiment, the circulating step is carried out at a temperature of about 1220° C.

In an embodiment, the donor substance is a metallic melt.

In an embodiment, the donor substance is a metallic granulate.

In an embodiment, the donor substance is chromium granulate.

In an embodiment, the activator is $NH_4Cl$.

In an embodiment, the circulation step further comprises injecting the propellant through the Venturi nozzle in a pulsed mode, whereby circulation pulses are repeatedly implemented as specific time intervals.

In an embodiment, the coating is a ceramic layer and the donor substance is $Zr(tmhd)_4$.

In an embodiment, the donor substance is $Zr(tmhd)_4$ and the heating step further comprises evaporating Zr from said $Zr(tmhd)_4$ resulting in a formation of the coating gas and the circulating step further comprises circulating the coating gas to the workpieces to be coated whereby the coating gas is circulated in the container a plurality of times.

In an embodiment, the donor substance is $Y(tmhd)_3$ and the heating step further comprises evaporating Y from $Y(tmhd)_3$ resulting in a formation of the coating gas and the circulating step further comprises circulating the coating gas to the workpieces to be coated whereby the coating gas is circulated in the container a plurality of times.

In an embodiment, the coating gas is circulated in the container with argon and an oxygen dopant.

In an embodiment, the present invention provides an apparatus for gas phase coating of workpieces which comprises a container accommodating at least one workpiece to be coated, a donor substance and an activator. The apparatus further comprises a heating device for heating the container so that a coating gas is formed from the donor substance and a means for circulating the coating gas within the container.

In an embodiment, the means for circulating comprises a Venturi nozzle disposed at an end of a propellant pipe that extends into the container.

In an embodiment, the container further comprises an upper region bound by a cover, and the apparatus further comprises at least one distributor diaphragm disposed in the upper region of the container and parallel to the cover.

In an embodiment, the apparatus further comprises a holding means for accommodating a plurality of workpieces at different vertical elevations within the container.

In an embodiment, the container further comprises a central region and an outer annular edge region in the means for circulating as well as the distributor diaphragm are arranged such that the coating gas flows upward through the central region of the container and downward through the outer annular edge region of the container during the circulation thereof.

Other objects and advantages of the invention will become apparent upon reading the following detailed description and appended claims, and upon reference to the accompanying drawings.

BRIEF DESCRIPTION OF THE DRAWINGS

The inventive gas phase coating process and the inventive apparatus for gas phase coating are described by way of example below on the basis of the drawings, whereby.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
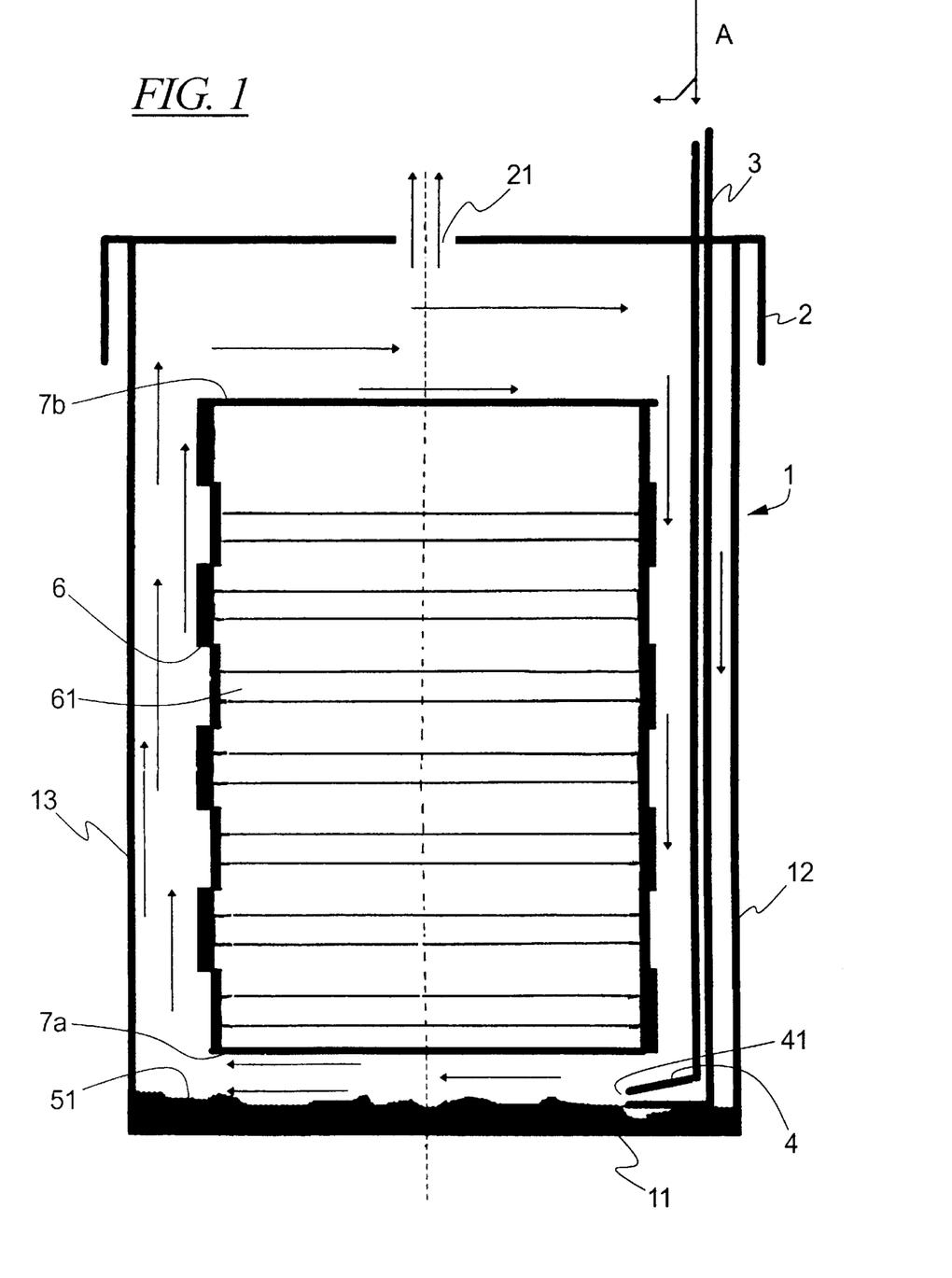
FIG. 1 illustrates, schematically, a coating apparatus according to a preferred embodiment of the invention.

FIG. 1 shows an apparatus for coating workpieces that is a preferred embodiment of the invention. The coating apparatus comprises a container 1 that is closed form above by a cover 2 lying loosely thereon. A propellant pipe 3 is conducted from above through the cover 2 into the interior of the container 1 and discharges in the lower region of the container just above the container floor 11. The propellant pipe 3 thereby proceeds in the edge region of the container 1 perpendicularly from top to bottom, parallel to a sidewall 12 of the container 1. A Venturi nozzle 4 is arranged at the end of the propellant pipe 3, the nozzle aperture 41 thereof pointing away from the sidewall 12, so that gas streaming out through the nozzle aperture 41 flows parallel to the container floor 11, as shown by the arrows. A chromium granulate 51 lies on the floor of the container, said chromium granulate 51 being mixed with powdered $NH_4Cl$ that serves as activator. The container floor 11 is covered with the chromium granulate 51 and the activator and the Venturi nozzle 4 is arranged thereover in the proximity of the sidewall 12 of the container 1 such that propellant streaming out through the Venturi nozzle 4 sweeps over the chromium granulate 51 and the activator.

A holder mechanism 6 for holding or, respectively, carrying a plurality of workpieces 61 to be coated, turbine blades in the present case, is arranged in a central region of the container 1.

During coating, the workpieces are held at different planes or, respectively, levels in the container 1, whereby approximately the entire interior of the container 1 is utilized. The workpieces or, respectively, turbine blades 61 are thereby seated parallel to one another in horizontal alignment in the holder mechanism 6. The holder mechanism 6 is fashioned in the form of a scaffold, so that it is open at its sides (not shown in the Figure) in order to assure an optimally free access of the coating gas to the blade surfaces. A respective baffle 7a, 7b that is fashioned as flat plate or, respectively, disk and is arranged in horizontal alignment parallel to the container floor 11 or, respectively, to the container cover 2 is located at the lower and at the upper end of the holder mechanism 6. Holes (not shown in the Figure) are arranged in the baffles 7a, 7b, so that coating gas can flow through the baffles 7a, 7b in vertical direction. The baffles 7a, 7b serve as distributor diaphragms in order to conduct the gas stream in the upper and in the lower region of the container 1 parallel to the container floor 11 or, respectively, container cover 2, i.e. in horizontal direction, and distribute it uniformly over the chromium granulate 51 and the activator lying on the container floor. An exhaust gas opening 21 for the elimination of the propellant is located in the middle of the container cover 2.

The inventive coating process is described below with reference to chrome plating of turbine blades as workpieces 61. After the workpieces 61, as explained above, have been arranged in the holder mechanism 6 inside the container 1, argon as propellant is introduced through the propellant pipe 3 into the container 1, as indicated by arrow A, whereby the container 1 stands in a furnace retort or, respectively, heating device (not shown) and is heated to a temperature of approximately 1100° C. The argon streams through the propellant pipe 3 and the Venturi nozzle 4 arranged at its end. When passing through the propellant pipe 3, the argon is heated and experiences a thermally caused expansion or, respectively, pressure increase in the end region of the propellant pipe 3. After emerging from the nozzle aperture 41, the argon flows in horizontal direction parallel to the surface of the chromium granulate 51 and the activator between the container floor 11 and the lower baffle 7a. Gaseous chromium chloride arises over the chromium granulate 51 as coating gas. Together with the propellant, the coating gas is conducted up at the sidewall 13 of the container 1 lying opposite the Venturi valve 4 and parallel thereto and is conducted horizontally toward the opposite side to the sidewall 12 in the upper region of the container 1 between the upper baffle 7b and the container cover 2. Since the coating gas is heavier than the propellant, a separation of the propellant from the coating gas ensues in the upper region of the container 1, so that the lighter propellant can escape upward from the exhaust gas opening 21. The heavier chromium chloride flows through the holes in the baffle 7b and downward in the region of the propellant pipe 3 along the sidewall 12, so that it comes into contact with the surfaces of the turbine blades. The chromium thereby diffuses into the workpiece or, respectively, blade surfaces, whereby cavities located in the inside of the blades also come uniformly into contact with the coating gas due to the circulation. After the chromium chloride gas has passed by the blade arrangement from top to bottom, it is again conducted over the chromium granulate 51 and the activator and participates again in the gas circulation in the container 1. Argon is thereby again supplied to the container inside through the propellant pipe 3, and the circulation of the coating gas is driven by the arrangement of the Venturi nozzle 4 or, respectively, by the propellant. The flow direction of the gas stream circulating in the container 1 is identified with arrows. In the present embodiment, the reactor vessel 1 has a diameter of 500 mm and a height of 810 mm.

In the process, HCl can be additionally added through the propellant pipe 3, as a result whereof the coating process is also held stable over a very long time span since a loss replenishment occurs for Correspondingly potentially taken from the circulation. In this case, the propellant pipe 3 is fabricated of ceramic in order not to be damaged by the HCl.

In another exemplary embodiment that is not shown here, the propellant escaping through the exhaust gas opening 21 is circulated outside the container and resupplied to the container via the propellant pipe 3.

The process is preferably implemented such that propellant is pumped in at specific time intervals, preferably every 10 minutes, for a duration of approximately 10 seconds, whereby the circulation during the propellant delivery is implemented with a propellant throughput of approximately 800–1000 liters per hour in the present case. The dilution of the coating gas is kept slight as a result of the pulse-like propellant delivery, and advantageous flow conditions for the diffusion coating given a uniform distribution of the coating gas in the entire interior of the container 1 are achieved. The propellant is circulated due to the flow at the Venturi nozzle 4 without employing mechanically moving parts. This is advantageous particularly at extremely high temperatures since no damage to bearings or, respectively, rotary and slide bushings through retort and reactor or, respectively, container 1 can occur due, for example, to thermal expansion. Expensive drive and control mechanisms are also not necessary, these also being susceptible to malfunction. By conducting the coating gas over the upper baffle 7b with the Venturi nozzle 4, a more uniform coating can ensue in a shorter time since the argon escapes through the exhaust gas opening and the heavier coating gas in turns falls down from top to bottom past the parts to be coated.

Figure 2:
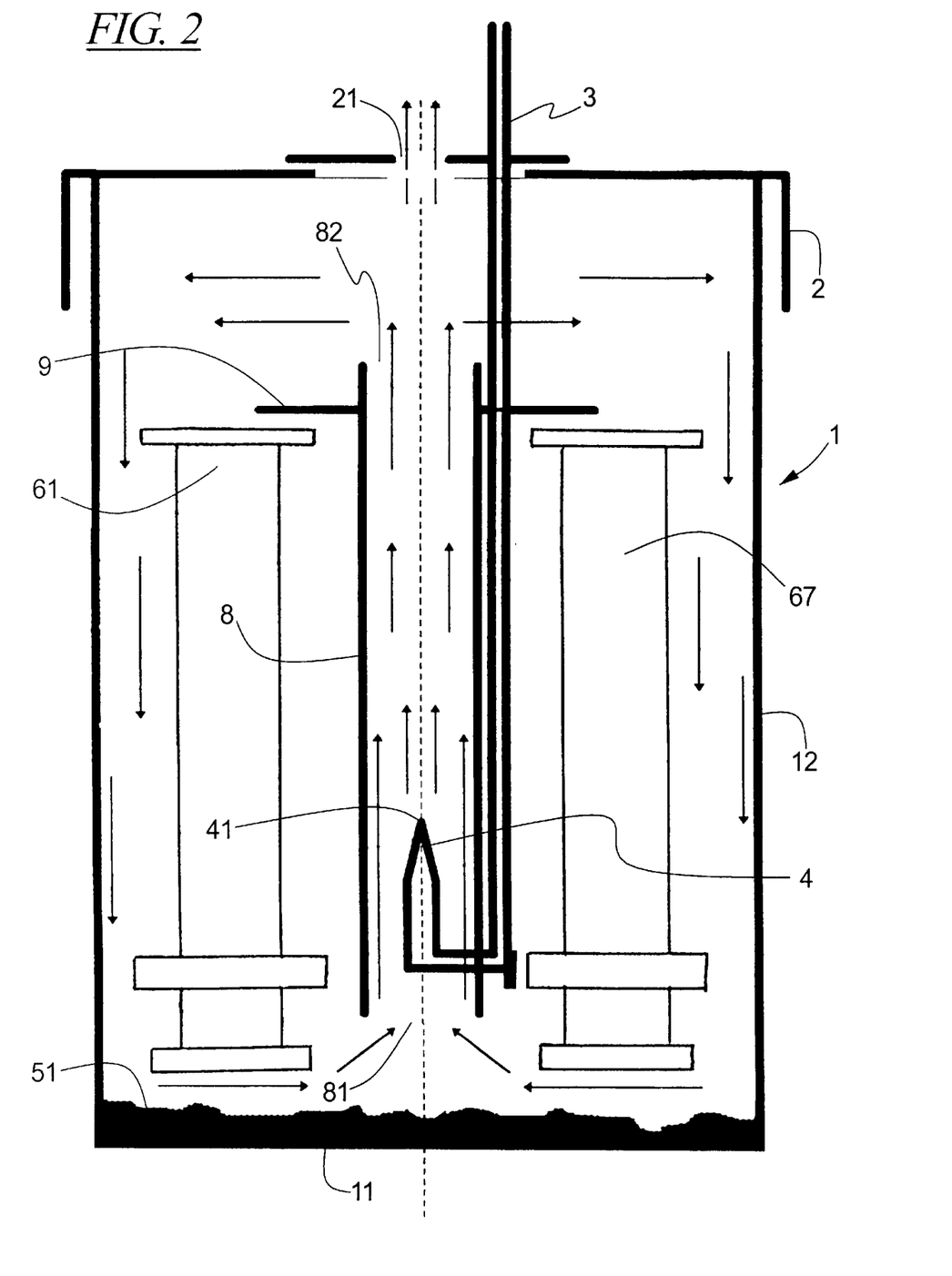
FIG. 2 illustrates, schematically, a coating apparatus according to a further embodiment of the invention.

FIG. 2 shows a further embodiment of the inventive coating apparatus that is employed for chrome-plating turbine blades. Identical or similar parts are provided with the same reference characters in the Figures. The Venturi nozzle 4 arranged at the end of the propellant pipe 3 is thereby directed such that its nozzle aperture 41 points up in the direction of the exhaust gas opening 21. The Venturi nozzle 4 is located in the middle between the sidewalls 12 of the cylindrical container 1 and is arranged in the lower region of the container 1. A tubular channel 8 is located in the middle of the container 1 and has a lower opening 81 and an upper opening 82 and extends up in vertical direction from the lower region of the container 1, whereby its diameter is approximately ⅕ through ⅙ the container diameter. The Venturi nozzle 4 is located inside the channel 8 in the lower region thereof, whereby the nozzle aperture 41 points in longitudinal direction of the channel towards its upper end. An annular, plat distributor diaphragm 9 is arranged at the outside of the channel wall in the upper region of the channel, this being horizontally aligned and extending partly over the turbine blades 61 arranged vertically in the container 1. The container 1 has a diameter of 500 mm and a height of 810 mm, and the chromium granulate 51 with the activator is located at its floor 11. A plurality of turbine blades 61 are aligned parallel to one another and arranged around the middle axis A of the container 1 or, respectively, the channel 8 located thereat.

During circulation, argon is conducted through the propellant pipe 3 into the container 1 and escapes upward through the nozzle aperture 41 of the Venturi nozzle 4 within the channel 8, so that is flows vertically up in the channel 8. Due to the action of the Venturi nozzle 4, coating gas is suctioned into the channel 8 at the lower opening 81 of the channel 8 and is conducted in the channel to the upper channel opening 82 together with the propellant. In the upper region of the container 1, the lighter propellant separates from the heavier coating gas and escapes via the exhaust gas opening 21. The heavier coating gas is conducted radially outward to the wall 12 of the container 1 between the reactor cover 2 and the distributor diaphragm 9 and falls down in the regions of the container 1 placed between the wall of the channel 8 and the sidewall 12, whereby it floods the turbine blades 61. In the proximity of the floor 11 of the container 1, the gas again encounters the chromium granulate 51, sweeping over its surface radially inward in horizontal direction in order to then re-enter the channel 8 at its lower opening 81. Due to the vertical arrangement of the turbine blades and the vertical gas circulation, hollow spaces, in particular, in the inside of the turbine blades 61 that extend in longitudinal direction thereof can be coated uniformly and with constant coat thickness.

Figure 3:
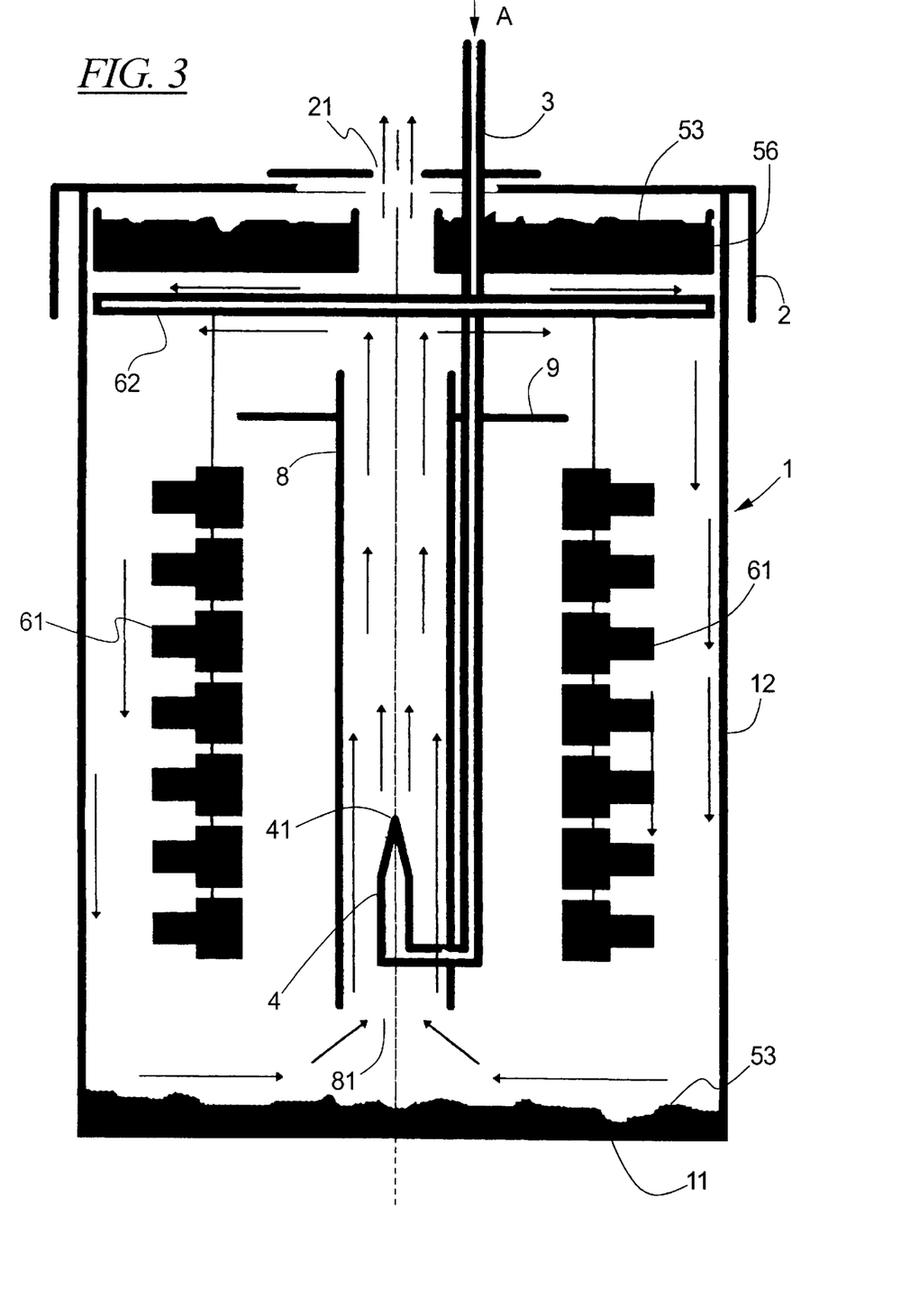
FIG. 3 illustrates, schematically, a coating apparatus according to yet another embodiment of the invention.

FIG. 3 schematically shows yet another preferred embodiment of the inventive coating apparatus, which is employed for alitizing rotor blades in this case. To that end, a CA50 granulate 53 together with an activator is located on the container floor 11 at the inside of the container. CA50 granulate is likewise arranged in basket-like donor containers 56 just below the container cover 2. The propellant tube 3, the Venturi nozzle 4 and the channel 8 with the distributor diaphragm 9 are arranged as in the embodiment described in FIG. 2. A plurality of turbine blades 61 are horizontally arranged above one another at different heights or, respectively, levels of the container 1 in the annular space between the wall of the channel 8 and the sidewall 12 of the cylindrical container 1. The blade arrangement is held in the container 1 by a batching frame 62.

During coating, the coating gas flows down from the granulate 53 in the upper region of the container, whereby it streams past the turbine blades 61. As in the embodiment shown in FIG. 2, propellant in the form of argon is conducted through the propellant pipe 3 and the Venturi nozzle 4 for circulating the coating gas and flows upwardly through the interior of the channel 8, whereby, however, it encounters the donor granulate 53 located thereat in the upper region of the container 1. Here, too, a separation of the lighter propellant from the heavy coating gas occurs, whereby the propellant escapes upward through the exhaust gas opening 21, whereas the heavier coating gas falls down along the turbine blades 61, whereupon it again encounters the CA50 granulate 53 and the activator lying on the container floor 11. Subsequently, the coating gas flows radially inward and again enters into the opening 81 of the channel 8 placed at the bottom thereof.

Figure 4:
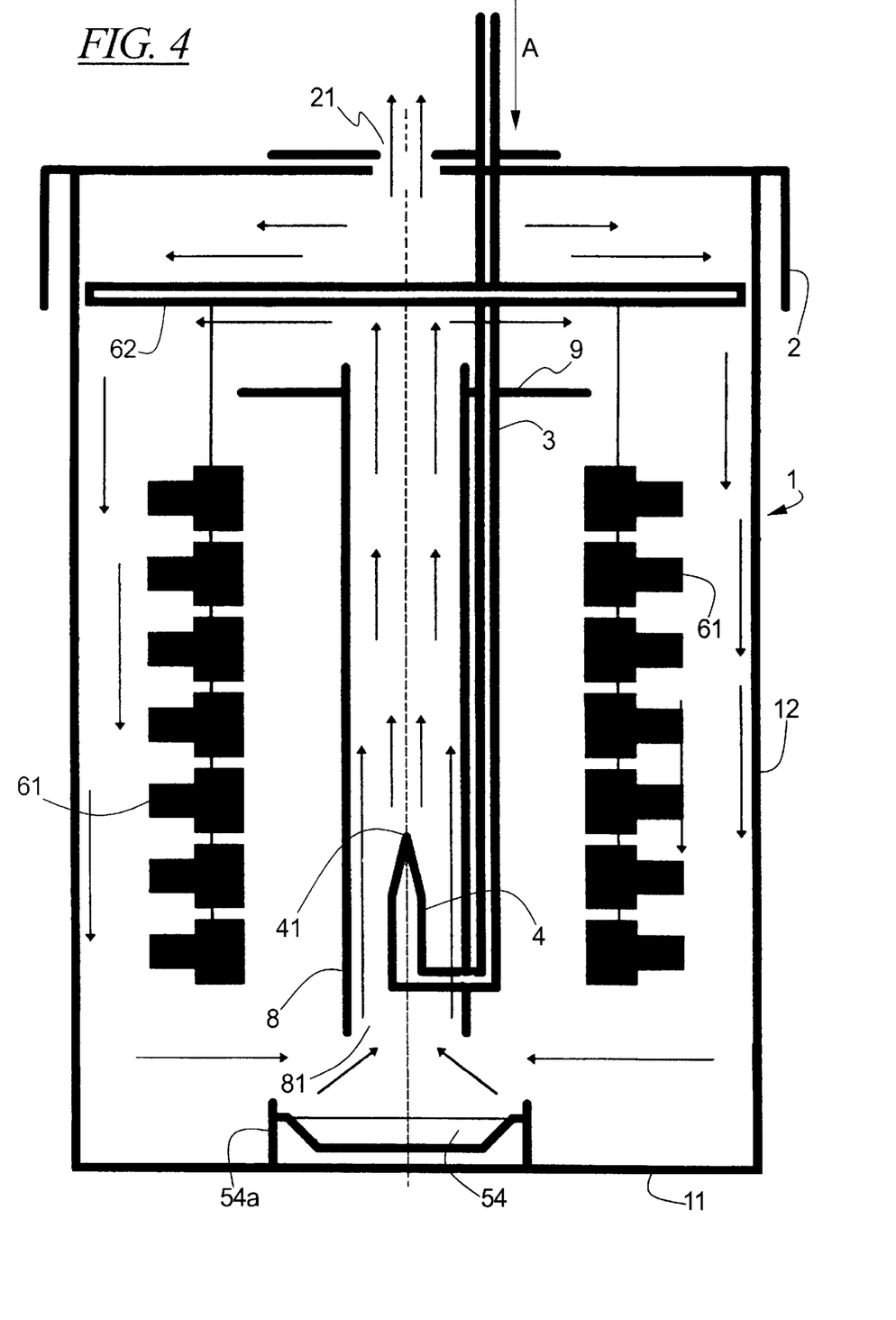
FIG. 4 illustrates, schematically, a coating apparatus for alitizing with an aluminum melt as donor.

FIG. 4 schematically shows an inventive coating device for alitizing, whereby an aluminum melt 54 is employed as donor substance. The gas flow in the container is like that indicated by the arrows in the preceding Figures. The structure is similar to that in the embodiment shown in FIG. 3, but the aluminum melt 54 together with an activator is arranged in the interior of the container 1 at the floor 11 thereof instead of the granulate. The aluminum melt 54 and the activator are located in a donor container 54a that has a circular wall and is arranged under the opening 81 of the channel 8.

As a result of a pulse-like charging of the coating apparatus with argon, which ensues every 10 minutes for a duration of approximately 10 seconds, whereby a throughput of approximately 1000 liters per second ensues during the charging or, respectively, inflow, the propellant together with the coating gas is conducted upward in the inside of the channel 8 into the upper region of the container 1, where the lighter propellant separates from the heavier coating gas. In the upper region of the container 1, the coating gas flows radially from the middle of the container 1 toward the outside to its sidewalls 12 parallel to the batching frame 62 and drops downward at said sidewalls 12, past the turbine blades 61. At the container floor 11, the gas stream encounters the aluminum melt 54 with the activator, as a result whereof it again picks up aluminum that is deposited at the surfaces of the turbine blades 61 during the next circulation.

The process is implemented at approximately 1100° C. through approximately 1230° C., whereby a coat gradient and, thus, different coat thicknesses are also avoided here due to a circulation of the coating gas without having to employ moving parts, bearings, seal and the like.

Figure 5:
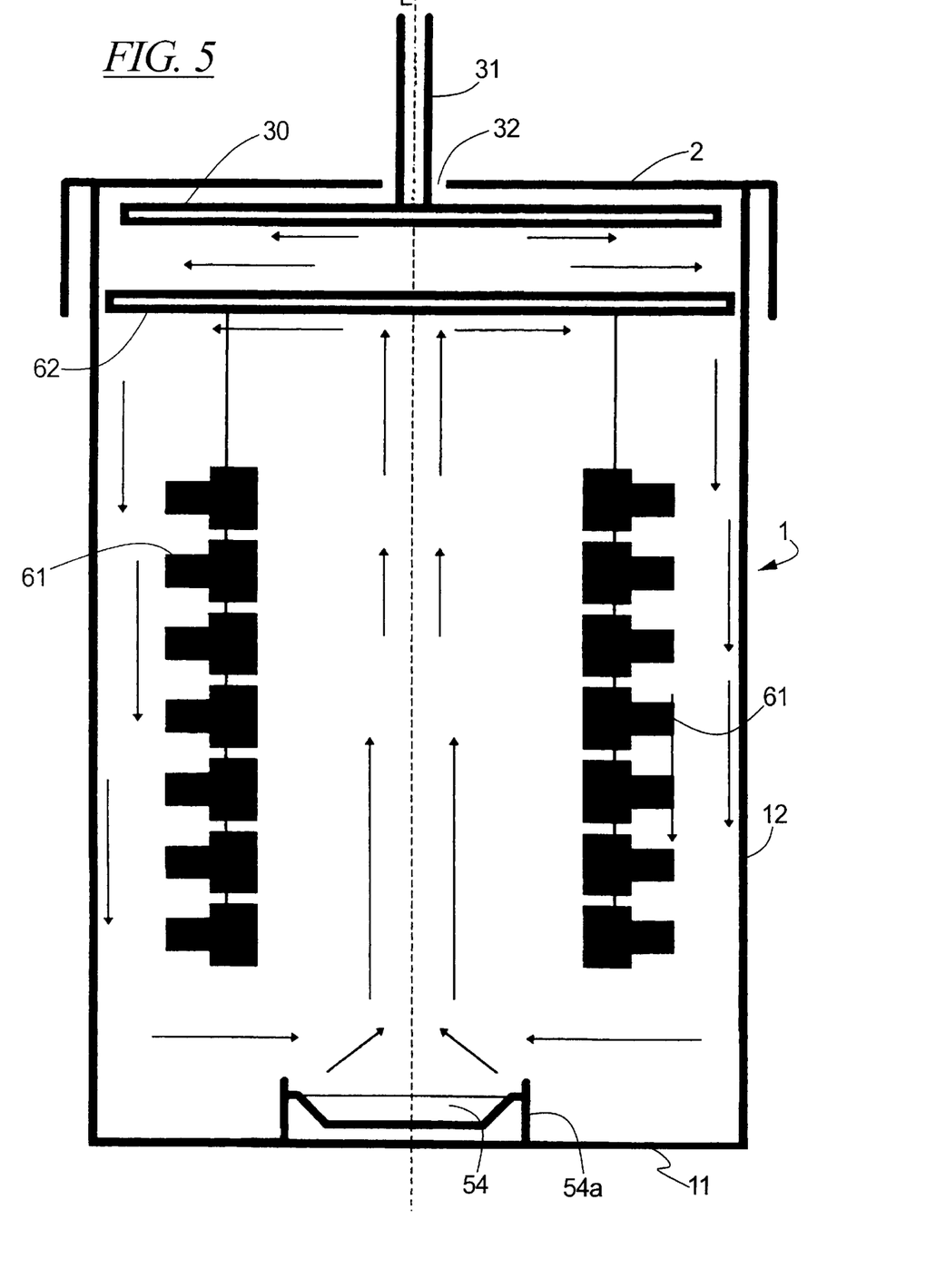
FIG. 5 illustrates, schematically, shows a coating apparatus with a rotating disk.

FIG. 5 shows yet another preferred embodiment of the inventive coating apparatus, which is employed for alitizing here. Here, too, an aluminum melt 54 and an activator are located on the container floor 11 in a donor container 54a that is arranged in the center on the container floor 11. A rotatable disk 30 that is horizontally directed and proceeds parallel to the cover 2 of the container 1 is arranged in the upper region of the container 1. A shaft 31 is rigidly connected to the disk 30 and extends perpendicular thereto in the direction of the longitudinal axis L of the container 1 through am opening 32 in the middle of the container cover 2. The shaft 31 has a large diameter and much play in the region of the opening 32 in order to avoid damage or, respectively, wear in the region of the shaft 31 or, respectively, of the opening 32 due to thermal expansion even at high temperatures.

By employing the rotating disk 30 as means for circulating the coating gas, increased wear or, respectively, material damage due to the high temperatures in the reactor space is avoided, which represents an advantage compared to the employment of, for example, a propeller. Given a rotation of the disk, gas particles adhere to the surface of the disk 30 and move outward to the outer edge of the disk 30 due to centrifugal force. A laminar flow that is directed radially outward from the center of the disk 30 arises due to the surface adhesion of the gas particles at the rotating disk 30 and friction between the gas particles. As a result thereof, a vertical circulation of the coating gas in container 1 is driven, whereby the coating gas rises vertically up in the center of the container, flows outward at the rotating disk 30 in the upper region of the container and flows down at the sidewalls 12 of the container, whereby it flows along the turbine blades 61 and subsequently passes the aluminum melt located at the floor in order to then re-ascend in the middle of the container 1. A closed gas circulation thus derives in the container. Given the example described here, the feet of the turbine blades 61 are covered by blade foot coverings.

The rotating disk 30 is fabricated of a nickel-based alloy; however, it can also be fabricated of ceramic.

The mechanical gas circulation has the advantage that no additional gas dilutes the coating gas and, thus, the entire coating activity is available for the parts to be coated. Damage in the region of the shaft and the lead-through through the cover 2 is avoided due to the embodiment with a very large shaft 31 with great play. The wear is greatly reduced even at high temperatures as a result of the implementation with a rotating disk. However, a propeller that is fabricated of a resistant material such as, for example, ceramic can also be employed instead of a rotating disk 30.

The retort (not shown in the Figures) in which the container 1 or, respectively, reactor is located is charged with gas, for example with Ar or $H_2$. As a result thereof, the space surrounding the container 1 is also kept free of oxygen. The interior of the container 1 and the interior of the retort are advantageously at the same or approximately same pressure level, so that great play of the shaft 31 in the container cover 2 is possible given a mechanical circulating means without the quality of the coating gas being negatively influenced. The reactor or, respectively, container 1 is placed into the furnace retort in the coating process and is annealed for a specific time under argon or $H_2$.

Figure 6:
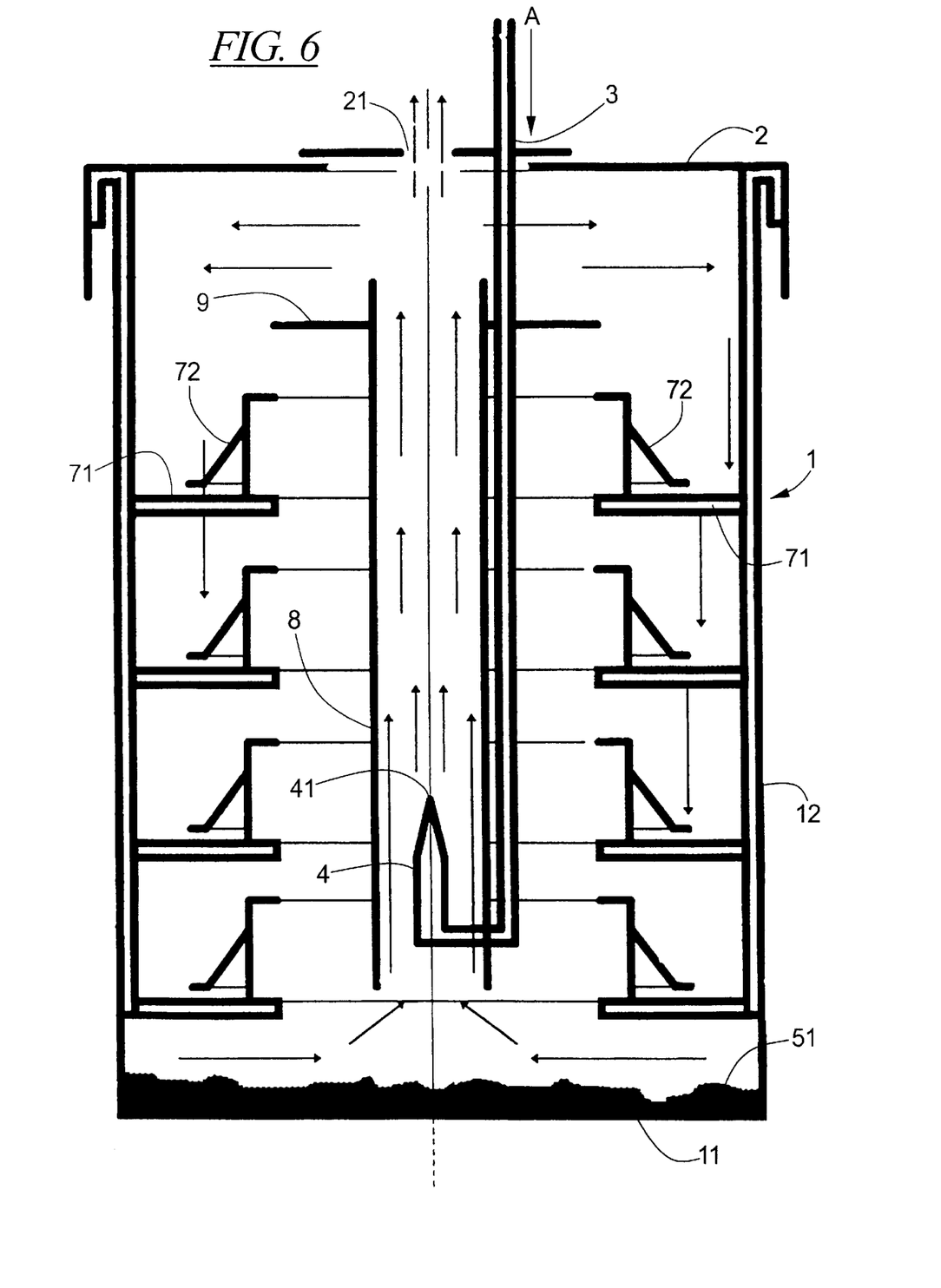
FIG. 6 illustrates, schematically, shows a coating apparatus for chrome-plating of housing parts with gas circulation.

FIG. 6 shows yet another inventive coating apparatus that is employed for chrome-plating housing parts. The container 1 with the propellant pipe 3, the Venturi nozzle 4 including the nozzle aperture 41 and the channel 8 with the distributor diaphragm is arranged in the container in a manner similar to the embodiment of the invention shown in FIG. 2. A chromium granulate 51 with an activator 71 is likewise located at the floor 11 of the container 1. Seating devices 71 are arranged on the inside of the sidewall 12 of the cylindrical container 1 at various heights of the inside or, respectively, payload space of the container 1. Housing rings 72 to be coated are respectively seated thereon.

Upon circulation, the argon propellant supplied from above flows from the nozzle aperture 41 and ascends in the channel 8 in the center of the container 1 to the top and is separated from the coating gas thereat due to its lighter weight. The coating gas flows radially outward in the upper region of the container and vertically down at the sidewall of the container, whereby it passes the housing rings 72 and encounters the chromium granulate 51 and the activator at the floor of the container 1 in order to then re-enter the channel 8 it is lower opening due to the effect of the Venturi nozzle.

Metallic diffusion layers, coating layers with no through slight drive-in and ceramic CVD layers can be applied with the present invention. For example, zirconium can be evaporated from $Zr(tmhd)_4$, be conducted to the parts in a reactor with argon and $O_2$ doping and be deposited as $ZrO_2$ ("tmhd" is well known to those skilled in the art as being a short-hand expression for "tetramethylheptanedionate"). However, Y from $Y(tmhd)_3$ can also be evaporated and conducted to the parts in a reactor with argon and $O_2$ doping and deposited as $Y_2O_3$. The advantage of these processes is that they occur at low process temperatures. In particular, a mechanical gas circulation is therefore easier to accomplish since there are no special demands made of materials design. Inorganic compounds such as, for example, TIBA in the form of a liquid evaporate at approximately 80° C., whereby the arising gas flows into the reactor and charges the workpieces to be coated. A circulation with, for example, a disk, a propeller or with propellant is thereby also possible.

A uniform coat is achieved with the present invention even at high temperatures, and a coat gradient on the coated part or, respectively, workpiece is largely avoided.

A uniform coating gas concentration is assured without the occurrence of too great a dilution and without requiring involved structures that, moreover, are cost-intensive and susceptible to failure. In particular, the installation of one or more Venturi nozzles is simple and can be accomplished with slight means. Less of a dilution of the coating gas is achieved by employing inter propellants, for example Ar, He, Kr, Ne, etc. However, $H_2$ is also possible as propellant when the formation of HF or HCl is desired on the basis of the coating process.

The inventive gas phase coating process and the inventive apparatus also offer a high flexibility since existing systems can be easily retrofitted and materials having various geometries can be coated without requiring a specific fashioning of the apparatus or an involved adaptation of the apparatus. Even cavities and channels in the inside of turbine blades can thus be coated, whereby non-uniform coat thicknesses are largely avoided.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A process for applying a coating gas to at least one workpiece, the process comprising the steps of:
   providing a container having a Venturi nozzle disposed therein and containing the at least one workpiece, a donor substance, and an activator;
   heating the container, donor substance and activator to form the coating gas from the donor substance; and
   circulating the coating gas within the container by injecting a propellant into the container through the Venturi nozzle, the propellant being selected from the group consisting of Ar, He, Kr, Ne and $H_2$.

2. The process of claim 1 wherein the container further comprises a top distributor diaphragm disposed above the at least one workpiece and a bottom distributor diaphragm disposed below the at least one workpiece.

3. The process of claim 1 wherein the at least one workpiece comprises a plurality of workpieces arranged vertically within the container.

4. The process of claim 1 the container further comprises an exhaust outlet and the process further comprising the steps of
   separating the propellant from the coating gas by gravitation in the upper region of the container; and
   eliminating the propellant from the container through the exhaust outlet.

5. The process of claim 1 wherein the Venturi nozzle is disposed in a lower region of the container so that the coating gas and the propellant circulate vertically upward.

6. The process of claim 1 wherein the circulating step is carried out at a temperature ranging from about 1000° C. to about 1300° C.

7. The process of claim 1 wherein the circulating step is carried out at a temperature of about 1220° C.

8. The process of claim 1 wherein the donor substance is a metallic melt.

9. The process of claim 1 wherein the donor substance is a metallic granulate.

10. The process of claim 1 wherein the donor substance is chromium granulate.

11. The process of claim 1 wherein the activator is $NH_4Cl$.

12. The process of claim 1 wherein the circulation step further comprises injecting the propellant through the Venturi nozzle in a pulsed mode, whereby circulation pulses are repeatedly implemented as specific time intervals.

13. The process of claim 1 wherein the coating is a ceramic layer and the donor substance is $Zr(tmhd)_4$.

14. The process of claim 1 the donor substance is $Zr(tmhd)_4$ and the heating step further comprises evaporating Zr from $Zr(tmhd)_4$ for forming the coating gas; and
   the circulating step further comprises circulating the coating gas to the workpieces to be coated, whereby the coating gas is circulated in the container a plurality of times.

15. The process of claim 14 wherein the coating gas is circulated in the container with argon and an $O_2$ doping.

16. The process of claim 1 the donor substance is $Y(tmhd)_3$ and the heating step further comprises evaporating Y from $Y(tmhd)_3$ for forming the coating gas; and
   the circulating step further comprises circulating the coating gas to the workpieces to be coated, whereby the coating gas is circulated in the container a plurality of times.

17. The process of claim 16 wherein the coating gas is circulated in the container with argon and an $O_2$ doping.

* * * * *